(12) United States Patent
Huang

(10) Patent No.: US 12,283,558 B2
(45) Date of Patent: Apr. 22, 2025

(54) HALF-BRIDGE CIRCUIT PACKAGE STRUCTURE

(71) Applicant: Motor Semiconductor Co., Ltd., Hsinchu County (TW)

(72) Inventor: Kuo-Lun Huang, Hsinchu (TW)

(73) Assignee: MOTOR SEMICONDUCTOR CO., LTD., Hsinchu County (TW)

( * ) Notice: Subject to any disclaimer, the term of this patent is extended or adjusted under 35 U.S.C. 154(b) by 796 days.

(21) Appl. No.: 17/549,910

(22) Filed: Dec. 14, 2021

(65) Prior Publication Data
US 2023/0187394 A1 Jun. 15, 2023

(51) Int. Cl.
*H01L 23/00* (2006.01)

(52) U.S. Cl.
CPC ...... *H01L 24/06* (2013.01); *H01L 2224/0603* (2013.01); *H01L 2224/0613* (2013.01); *H01L 2224/48177* (2013.01)

(58) Field of Classification Search
CPC ............. H01L 24/06; H01L 2224/0603; H01L 2224/04; H01L 2224/47; H01L 2224/48; H01L 2224/481; H01L 2224/48177

USPC ......................................................... 257/786
See application file for complete search history.

(56) References Cited

U.S. PATENT DOCUMENTS

| 2016/0247751 | A1* | 8/2016 | Kinzer | H01L 24/49 |
| 2021/0391311 | A1* | 12/2021 | Rhodes | H01L 23/50 |
| 2022/0084978 | A1* | 3/2022 | Kinzer | H01L 25/18 |
| 2022/0102251 | A1* | 3/2022 | Kinzer | H01L 24/73 |
| 2023/0335464 | A1* | 10/2023 | Gupta | H10D 88/00 |

* cited by examiner

*Primary Examiner* — Matthew E. Gordon
(74) *Attorney, Agent, or Firm* — WPAT, PC

(57) ABSTRACT

A half-bridge circuit package structure includes a chip pad, a first metal island, a driving chip, an upper bridge switch, and a lower bridge switch. The driving chip includes a ground pad and a high side ground pad. The upper bridge switch includes a first enhancement mode transistor and a first depletion mode transistor. A drain pad of the first depletion mode transistor is electrically connected to the first metal island. The lower bridge switch includes a second enhancement mode transistor and a second depletion mode transistor. A source pad of the second depletion mode transistor is electrically connected to a drain pad of the second enhancement mode transistor. A drain pad of the second depletion mode transistor is electrically connected to the first metal island.

19 Claims, 9 Drawing Sheets

HALF-BRIDGE CIRCUIT PACKAGE STRUCTURE

BACKGROUND OF THE INVENTION

1. Field of the Invention

The present invention generally relates to a package structure and, more particularly, to a half-bridge circuit package structure.

2. Description of the Related Art

The switch apparatus formed by a cascode connection of a depletion mode MOSFET and an enhancement mode MOSFET has been commonly used in bridge circuits, due to the advantages of high switching frequency and low power loss. Further, a plurality of components of the bridge circuit can be integrated into an integrated bridge circuit in an independent package type. Compared with a discrete bridge circuit, the integrated bridge circuit can reduce the parasitic inductance and parasitic resistance generated by the connection wires between the components, thereby having better performance. However, the substrates and manufacturing processes for the enhancement mode transistor and the depletion mode transistor are different. Therefore, the package structure of the conventional half-bridge circuit utilizes a multi-chip package (MCP) method and includes components like a driving chip, an upper bridge switch, and a lower bridge switch. In which, the upper bridge switch and the lower bridge switch are respectively the switch apparatus set forth above.

Among the various components of the above-mentioned conventional half-bridge circuit package structure, some wires cannot be completely connected inside the package structure, so that it is necessary to have external connection wires outside the package structure forming a complete half-bridge circuit. However, the external connection wires would cause inconvenience of using the half-bridge circuit. Moreover, they still generate the parasitic inductance and parasitic resistance, resulting in poor performance of the half-bridge circuit.

In light of the above problem, it is necessary to improve the conventional half-bridge circuit package structure.

SUMMARY OF THE INVENTION

It is therefore an objective of this invention to provide a half-bridge circuit package structure which is convenient to use.

It is another objective of this invention to provide a half-bridge circuit package structure which can enhance the performance of the integrated half-bridge circuit.

As used herein, the term "a", "an" or "one" for describing the number of the elements and members of the present invention is used for convenience, provides the general meaning of the scope of the present invention, and should be interpreted to include one or at least one. Furthermore, unless explicitly indicated otherwise, the concept of a single component also includes the case of plural components.

In an aspect, a half-bridge circuit package structure according to the invention includes a chip pad, a substrate bonded to the chip pad, a driving chip disposed on the chip pad, an upper bridge switch bonded to the substrate, and a lower bridge switch bonded to the substrate. The substrate includes a first metal island electrically connected to a high side ground pin. The driving chip includes a ground pad, a low side output pad, a high side ground pad, and a high side output pad. The driving chip is electrically connected to a high side power pin by a high side power pad, to an input power pin by an input power pad, to a high side input pin by a high side input pad, and to a low side input pin by a low side input pad. The upper bridge switch has a first enhancement mode transistor and a first depletion mode transistor. A gate pad of the first enhancement mode transistor is electrically connected to the high side output pad. A source pad of the first enhancement mode transistor is electrically connected to the first metal island and the high side ground pad. A gate pad of the first depletion mode transistor is electrically connected to the source pad of the first enhancement mode transistor. A source pad of the first depletion mode transistor is electrically connected to a drain pad of the first enhancement mode transistor. A drain pad of the first depletion mode transistor is electrically connected to a power pin. The lower bridge switch has a second enhancement mode transistor and a second depletion mode transistor. A gate pad of the second enhancement mode transistor is electrically connected to the low side output pad. A source pad of the second enhancement mode transistor is electrically connected to a common contact pin. A gate pad of the second depletion mode transistor is electrically connected to the source pad of the second enhancement mode transistor. A source pad of the second depletion mode transistor is electrically connected to a drain pad of the second enhancement mode transistor. A drain pad of the second depletion mode transistor is electrically connected to the high side ground pin.

Thus, the half-bridge circuit package structure according to the invention includes the substrate with the first metal island. By providing the first metal island as the connection point of the electrical signal, the components of the half-bridge circuit package structure can be conveniently connected to each other, so as to constitute a complete integrated half-bridge circuit in a single package structure. As such, the integrated half-bridge circuit does not need an external connection wire to be completed, ensuring the effect of convenience in use. Furthermore, it can also avoid the interference and energy consumption resulted from the parasitic inductance and parasitic resistance of the external connection wires, ensuring the effect of improving the efficiency of the integrated half-bridge circuit.

In an example, the substrate is a direct bonded copper substrate, a direct plated copper substrate or a printed circuit board. As such, the substrate can have better electrical conductivity and thermal conductivity, ensuring the effects of reducing the power consumption of the circuit and improving the heat dissipation of the circuit components.

In an example, the substrate has a plurality of component metal islands. The first enhancement mode transistor and the first depletion mode transistor are respectively located on two of the plurality of component metal islands. The drain pad of the first enhancement mode transistor is connected and conducted to the component metal island where the first enhancement mode transistor is located. The source pad of the first depletion mode transistor is electrically connected to the component metal island where the first enhancement mode transistor is located. The second enhancement mode transistor and the second depletion mode transistor are respectively located on two of the plurality of component metal islands. The drain pad of the second enhancement mode transistor is connected and conducted to the component metal island where the second enhancement mode transistor is located. The source pad of the second depletion mode transistor is electrically connected to the component metal island where the second enhancement mode transistor is located. As such, the plurality of component metal islands can conduct heat energy of the upper bridge switch and the lower bridge switch, ensuring the effect of improving the heat dissipation of the upper bridge switch and the lower bridge switch.

In an example, the high side ground pad is electrically connected to the first metal island. The source pad of the first enhancement mode transistor is electrically connected to the high side ground pad through the first metal island. As such, it achieves the effect of facilitating the connection between the source pad of the first enhancement mode transistor and the high side ground pad.

In an example, the gate pad of the first depletion mode transistor is electrically connected to the first metal island, and the gate pad of the first depletion mode transistor is electrically connected to the source pad of the first enhancement mode transistor through the first metal island. As such, it achieves the effect of facilitating the connection between the gate pad of the first depletion mode transistor and the source pad of the first enhancement mode transistor.

In an example, the drain pad of the second depletion mode transistor is electrically connected to the first metal island, and the drain pad of the second depletion mode transistor is electrically connected to the high side ground pin through the first metal island. As such, it achieves the effect of facilitating the connection between the drain pad of the second depletion mode transistor and the high side ground pin.

In an example, the substrate has a second metal island. The substrate is electrically connected to the common contact pin, the source pad of the second enhancement mode transistor, and the gate of the second depletion mode transistor. As such, utilizing the second metal island to connect the second depletion mode transistor and the second enhancement mode transistor achieves has the effect of easy manufacturing.

In an example, the ground pad is electrically connected to the second metal island. As such, it achieves the effect of facilitating the connection between the source pad of the second enhancement mode transistor and the ground pad.

In an example, the first enhancement mode transistor is directly connected and conducted to the first metal island by the source pad of the first enhancement mode transistor, and is electrically connected to the high side ground pad through the first metal island. The second enhancement mode transistor is directly connected and conducted to the second metal island by the source pad of the second enhancement mode transistor. As such, it can reduce the number of bonding wires and the bonding space during packaging, ensuring the effect of reducing the volume of the package structure.

In an example, the driving chip is bonded to the substrate. The high side ground pad of the driving chip faces the substrate and is directly connected and conducted to the first metal island. And, the ground pad of the driving chip faces the substrate and is directly connected and conducted to the second metal island. As such, it can reduce the number of bonding wires and the bonding space during packaging, ensuring the effect of reducing the volume of the package structure.

In an example, the high side ground pad is directly electrically connected to the source pad of the first enhancement mode transistor. As such, the high side ground pad can be prevented from being directly connected to a high-current transmission path, ensuring the effect of reducing the high-current noise interference of the driving chip.

In an example, the gate pad of the first depletion mode transistor is directly electrically connected to the source pad of the first enhancement mode transistor. As such, the upper bridge switch can reduce the current passing through the metal island, ensuring the effect of reducing the high-current noise interference of the upper bridge switch.

In an example, the drain pad of the second depletion mode transistor is directly electrically connected to the high side ground pin. As such, the lower bridge switch can reduce the current passing through the metal island, ensuring the effect of reducing the high-current noise interference of the lower bridge switch.

In an example, the ground pad is directly electrically connected to the source pad of the second enhancement mode transistor. As such, the ground pad can be prevented from being directly connected to a high-current transmission path, ensuring the effect of reducing the high-current noise interference of the driving chip.

In an example, the half-bridge circuit package structure further includes a ground pin. The ground pin is electrically connected to the ground pad. As such, the ground pad can be prevented from being grounded by a high-current transmission path, ensuring the effect of avoiding malfunction of the driving chip caused by the high-current noise.

In an example, the ground pin is directly electrically connected to the ground pad. The source pad of the second enhancement mode transistor is electrically connected to the ground pin through the ground pad. As such, the ground pad can be prevented from being grounded by a high-current transmission path, ensuring the effect of avoiding malfunction of the driving chip caused by the high-current noise.

In an example, the ground pin is directly electrically connected to the ground pad and the source pad of the second enhancement mode transistor respectively. The source pad of the second enhancement mode transistor is electrically connected to the ground pad through the ground pin. As such, the ground pad and the second enhancement mode transistor can be prevented from being grounded by a high-current transmission path, ensuring the effect of avoiding malfunction of the driving chip and the lower bridge switch caused by the high-current noise.

In an example, the ground pad and the gate pad of the second depletion mode transistor are electrically connected to the source pad of the second enhancement mode transistor through the common contact pin. As such, the gate pad of the second depletion mode transistor, the ground pad and the source pad of the second enhancement mode transistor are connected without the metal island, which can reduce the space of the half-bridge circuit package structure, ensuring the effect of reducing the volume of the package structure.

In an example, the substrate has a plurality of component metal islands. The driving chip is bonded to one of the plurality of component metal islands of the substrate. As such, it can save the space of the half-bridge circuit package structure, ensuring the effect of reducing the volume of the package structure.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

Figure 1:
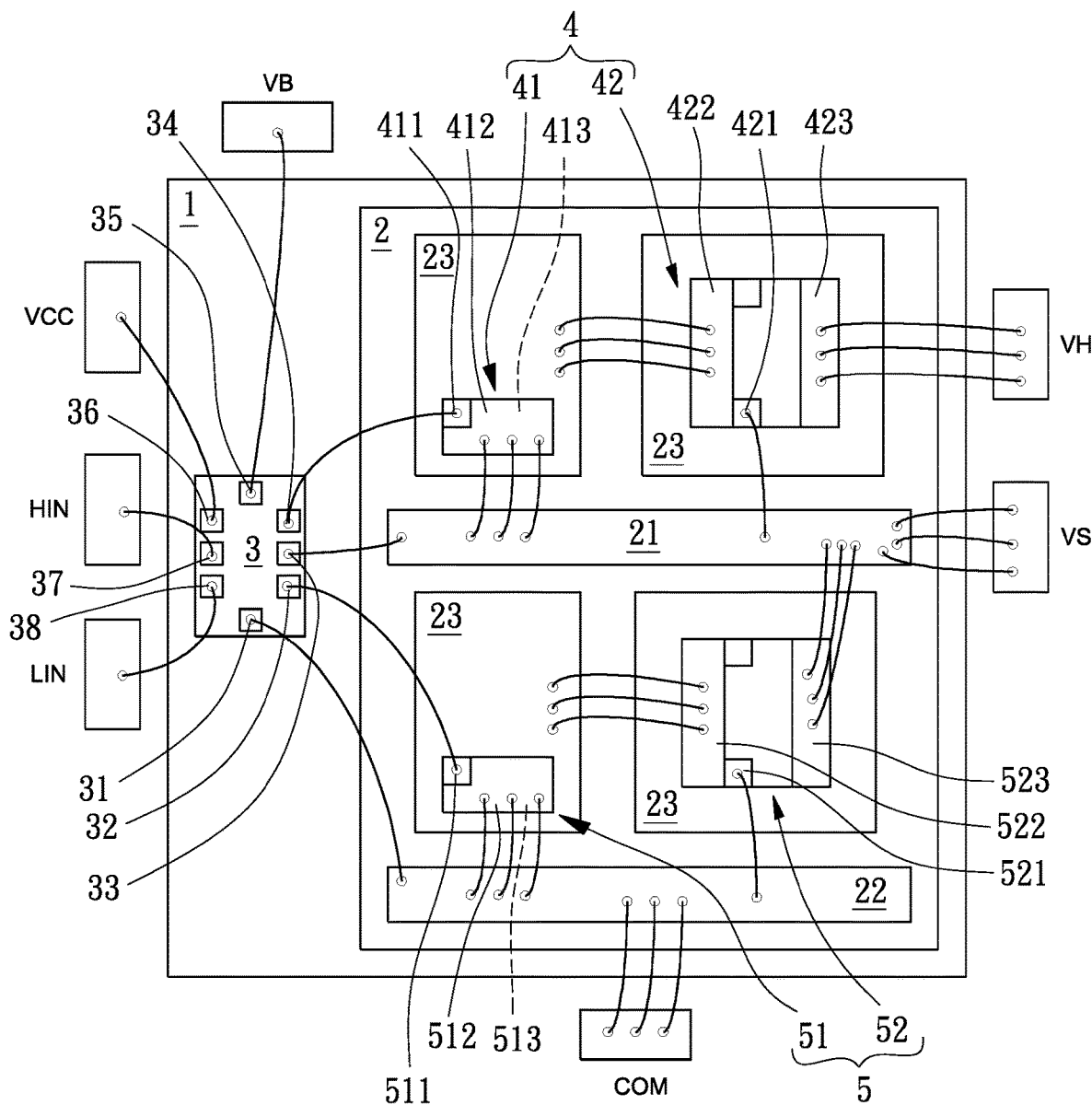
FIG. 1 is a front view of the assembly in the first embodiment of the invention.

In the various figures of the drawings, the same numerals designate the same or similar parts. Furthermore, when the terms "front", "rear", "left", "right", "up (top)", "down (bottom)", "inner", "outer", "side", and similar terms are used hereinafter, it should be understood that these terms have reference only to the structure shown in the drawings as it would appear to a person viewing the drawings, and are utilized only to facilitate describing the invention.

DETAILED DESCRIPTION OF THE INVENTION

FIG. 1 shows a half-bridge circuit package structure in the first embodiment according to the invention, which includes a chip pad 1, a substrate 2, a driving chip 3, an upper bridge switch 4, and a lower bridge switch 5. The substrate 2 is bonded to the chip pad 1. The driving chip 3 is carried by the chip pad 1. The upper bridge switch 4 and the lower bridge switch 5 are bonded to the substrate 1. The driving chip 3, the upper bridge switch 4 and the lower bridge switch 5 are electrically connected to each other.

The chip pad 1 carries each component of the half-bridge circuit package structure. The dimension and shape of the chip pad 1 can be chosen by those skilled in the art according to the requirements of various package structures, and are not limited in the present invention.

The substrate 2 is a Direct Bonded Copper (DBC) substrate, a Direct Plated Copper (DPC) substrate or a Printed Circuit Board (PCB), which have better electrical conductivity and thermal conductivity. The substrate 2 has a plurality of metal conductors, including a first metal island 21, a second metal island 22, and a plurality of component metal islands 23, which can be provided as the connection point of the electrical signal. The first metal island 21 is electrically connected to a high side ground pin VS, the second metal island 22 is electrically connected to a common contact pin COM. In addition, the upper bridge switch 4 and the lower bridge switch 5 can also be respectively located on the plurality of component metal islands 23. Thereby, the plurality of component metal islands 23 can conduct heat energy of the upper bridge switch 4 and the lower bridge switch 5. The locations, shapes and dimensions of the first metal island 21, the second metal island 22, and the plurality of component metal islands 23 as set forth above can be chosen according to the requirements of various package structures, and are not limited in the present invention.

The driving chip 3 is a bare die with semiconductor integrated circuit. In this embodiment, the driving chip 3 is located on the chip pad 1 instead of being bonded to the substrate 2, so that the influence of the heat energy of the upper bridge switch 4 and the lower bridge switch 5 on the driving chip 3 can be decreased. The driving chip 3 is adapted to switch the on and off states of the upper bridge switch 4 and the lower bridge switch 5. The driving chip 3 is connected to the upper bridge switch 4 and the lower bridge switch 5. The driving chip 3 has a grounding pad (GND_IC pad) 31, a low side output pad (LO pad) 32, a high side ground pad (VS_IC pad) 33, and a high side output pad (HO pad) 34. In which, the ground pad 31 is electrically connected to the second metal island 22, and the high side ground pad 33 is electrically connected to the first metal island 21. In addition, the driving chip 3 can also be electrically connected to a high side power pin VB by a high side power pad (VB_IC pad) 35, electrically connected to an input power pin VCC by an input power pad (VCC_IC pad) 36, electrically connected to a high side input pin HIN by a high side input pad (HIN_IC pad) 37, and electrically connected to a low side input pin LIN by a low side input pad (LIN_IC pad) 38.

The upper bridge switch 4 has a first enhancement mode transistor 41. A top side of the first enhancement mode transistor 41 has a gate pad 411 and a source pad 412, and a bottom side of the first enhancement mode transistor 41 has a drain pad 413. The upper bridge switch 4 further has a first depletion mode transistor 42. A gate pad 421, a source pad 422, and a drain pad 423 of the first depletion mode transistor 42 can all be located at the top side of the first depletion mode transistor 42.

In this embodiment, the first enhancement mode transistor 41 and the first depletion mode transistor 42 are respectively located on two of the plurality of component metal islands 23. In other embodiments, the first enhancement mode transistor 41 and the first depletion transistor 42 can also share the same component metal island 23, which is understood by those skilled in the art. The gate pad 411 of the first enhancement mode transistor 41 is electrically connected to the high side output pad 34 of the driving chip 3. The source pad 412 of the first enhancement mode transistor 41 is electrically connected to the first metal island 21, and electrically connected to the high side ground pad 33 of the driving chip 3 by the first metal island 21. The drain pad 413 of the first enhancement mode transistor 41 is connected and conducted to the component metal island 23 where it is located. The source pad 422 of the first depletion mode transistor 42 is electrically connected to the component metal island 23 where the first enhancement mode transistor 41 is located, so as to be electrically connected to the drain pad 413 of the first enhancement mode transistor 41. The drain pad 423 of the first depletion mode transistor 42 is electrically connected to a power pin VH.

The lower bridge switch 5 has a second enhancement mode transistor 51. The second enhancement mode transistor 51 has a gate pad 511 and a source pad 512 on a top side thereof, and a drain pad 513 located on a bottom side thereof. The lower bridge switch 5 further has a second depletion mode transistor 52. The second depletion mode transistor 52 can have a gate pad 521, a source pad 522, and a drain pad 523, all of which are located on the top side of the depletion mode transistor 52.

In this embodiment, the second enhancement mode transistor 51 and the second depletion mode transistor 52 are respectively located on two of the plurality of component metal islands 23. In other embodiments, the second enhancement mode transistor 51 and the second depletion mode transistor 52 can also share the same component metal island 23, which is understood by those skilled in the art. The gate pad 511 of the second enhancement mode transistor 51 is electrically connected to the low side output pad 32 of the driving chip 3. The source pad 512 of the second enhancement mode transistor 51 is electrically connected to the second metal island 22, and electrically connected to the ground pad 31 of the driving chip 3 and the common contact pin COM by the second metal island 22. The drain pad 513 of the second enhancement mode transistor 51 is connected and conducted to the component metal island 23 where it is located. The gate pad 521 of the second depletion mode transistor 52 is electrically connected to the second metal island 22, and electrically connected to the source pad 512 of the second enhancement mode transistor 51 and the ground pad 31 of the driving chip 3 by the second metal island 22. The source pad 522 of the second depletion mode transistor 52 is electrically connected to the component metal island 23 where the second enhancement mode transistor 51 is located, so as to be electrically connected to the drain pad 513 of the second enhancement mode transistor 51. The drain pad 523 of the second depletion mode transistor 52 is electrically connected to the first metal island 21.

In the half-bridge circuit package structure of the present invention, the high side input pad 37 of the driving chip 3 can receive a high side input signal, and the high side input signal makes the high side output pad 34 of the driving chip 3 generate a high side output signal. The low side input pad 38 of the driving chip 3 can receive a low side input signal, and the low side input signal makes the low side output pad 32 of the driving chip 3 generate a low side output signal. The driving chip 3 can drive the upper bridge switch 4 and the lower bridge switch 5 to switch between on and off states by the high side output signal and the low side output signal.

Figure 2:
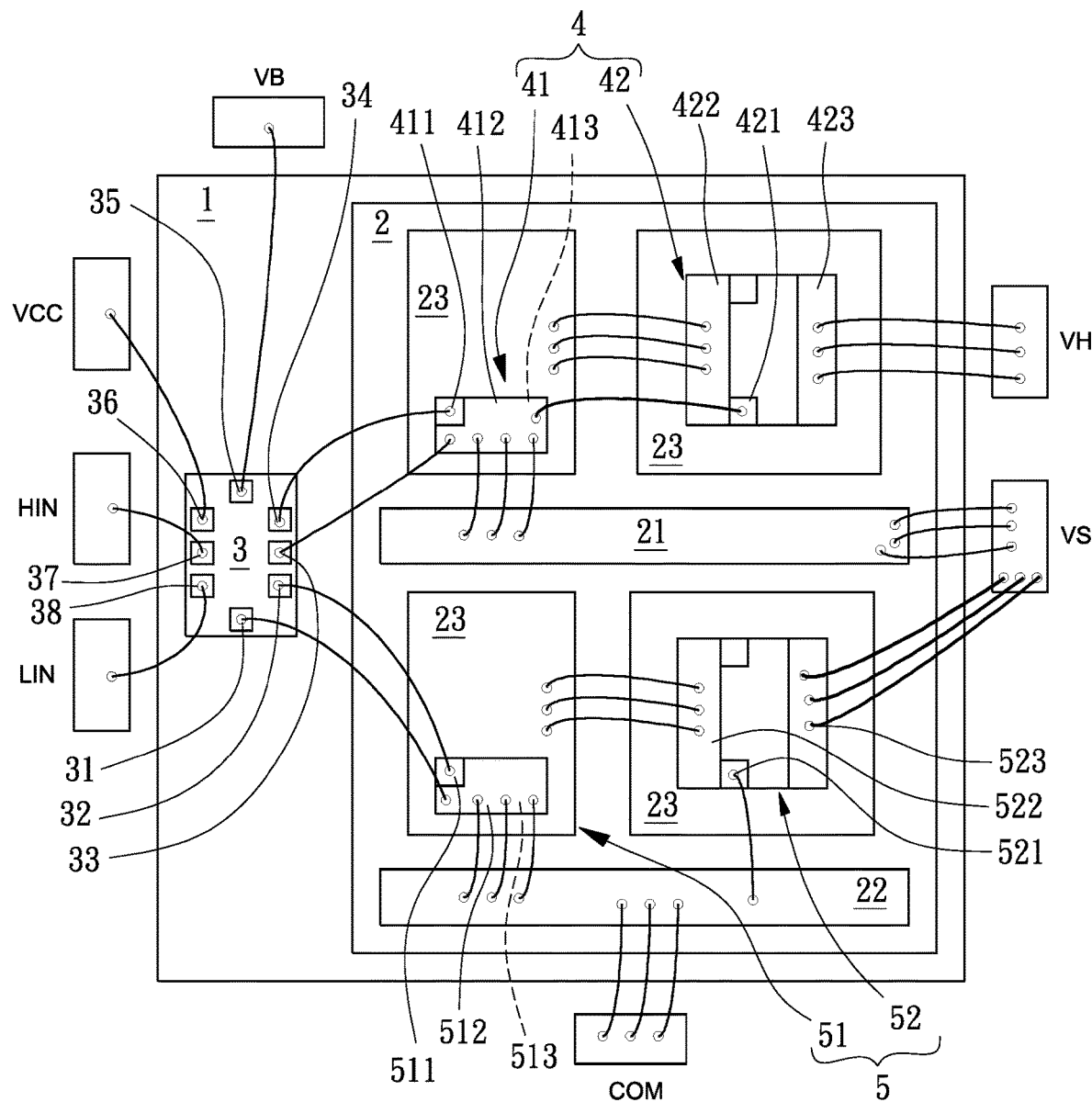
FIG. 2 is a front view of the assembly in the second embodiment of the invention.

Referring to FIG. 2, which shows the half-bridge circuit package structure in the second embodiment of the present invention. In this embodiment, the high side ground pad 33 of the driving chip 3 is directly electrically connected to the source pad 412 of the first enhancement mode transistor 41. The gate pad 421 of the first depletion mode transistor 42 is directly electrically connected to the source pad 412 of the first enhancement mode transistor 41. The drain pad 523 of the second depletion mode transistor 52 is directly electrically connected to the high side ground pin VS. The ground pad 31 of the driving chip 3 is directly electrically connected to the source pad 512 of the second enhancement mode transistor 51. Thereby, the high side ground pad 33 and the ground pad 31 can avoid from being directly connected to a high-current transmission path.

Figure 3:
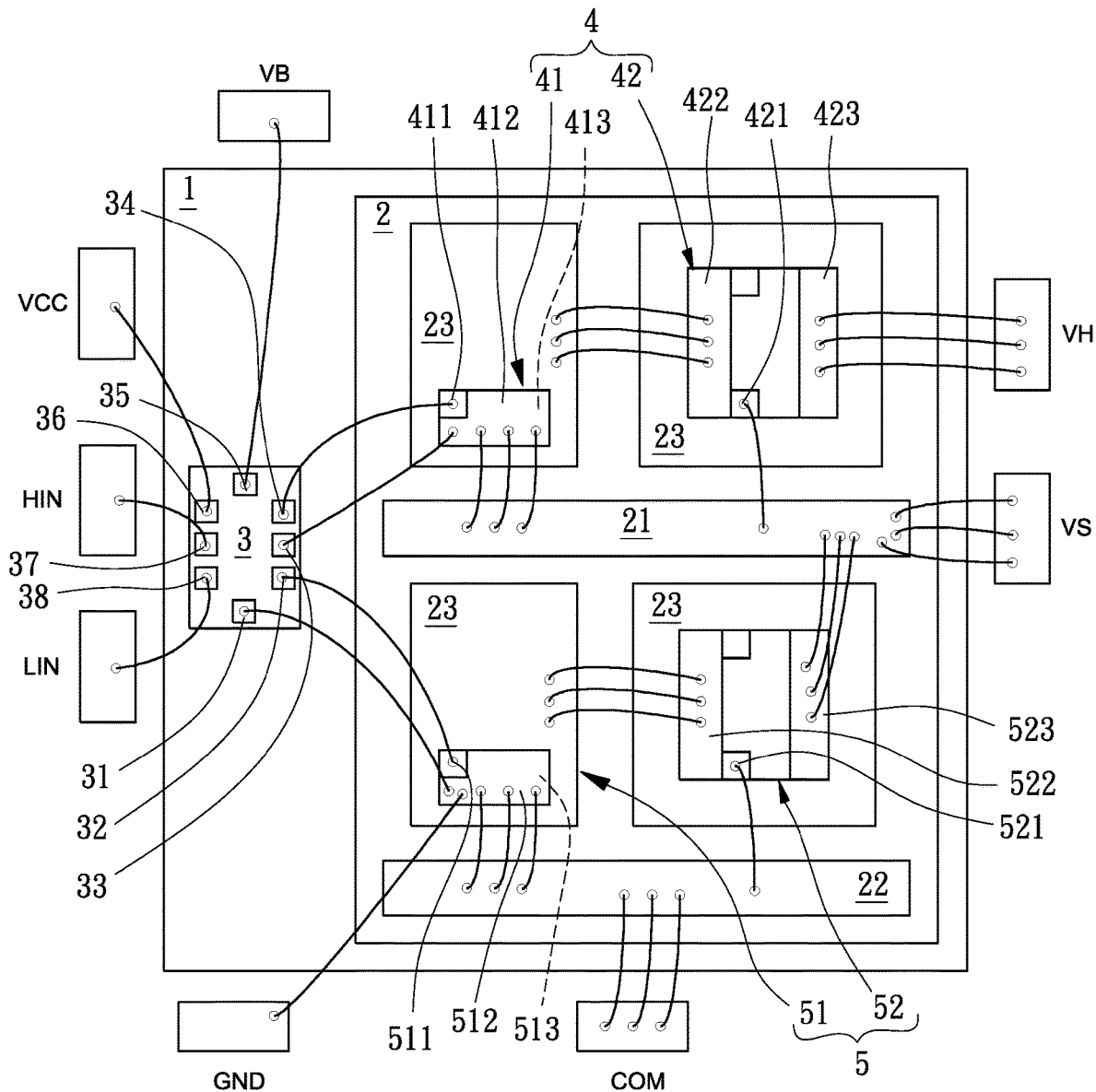
FIG. 3 is a front view of the assembly in the third embodiment of the invention.
Figure 4:
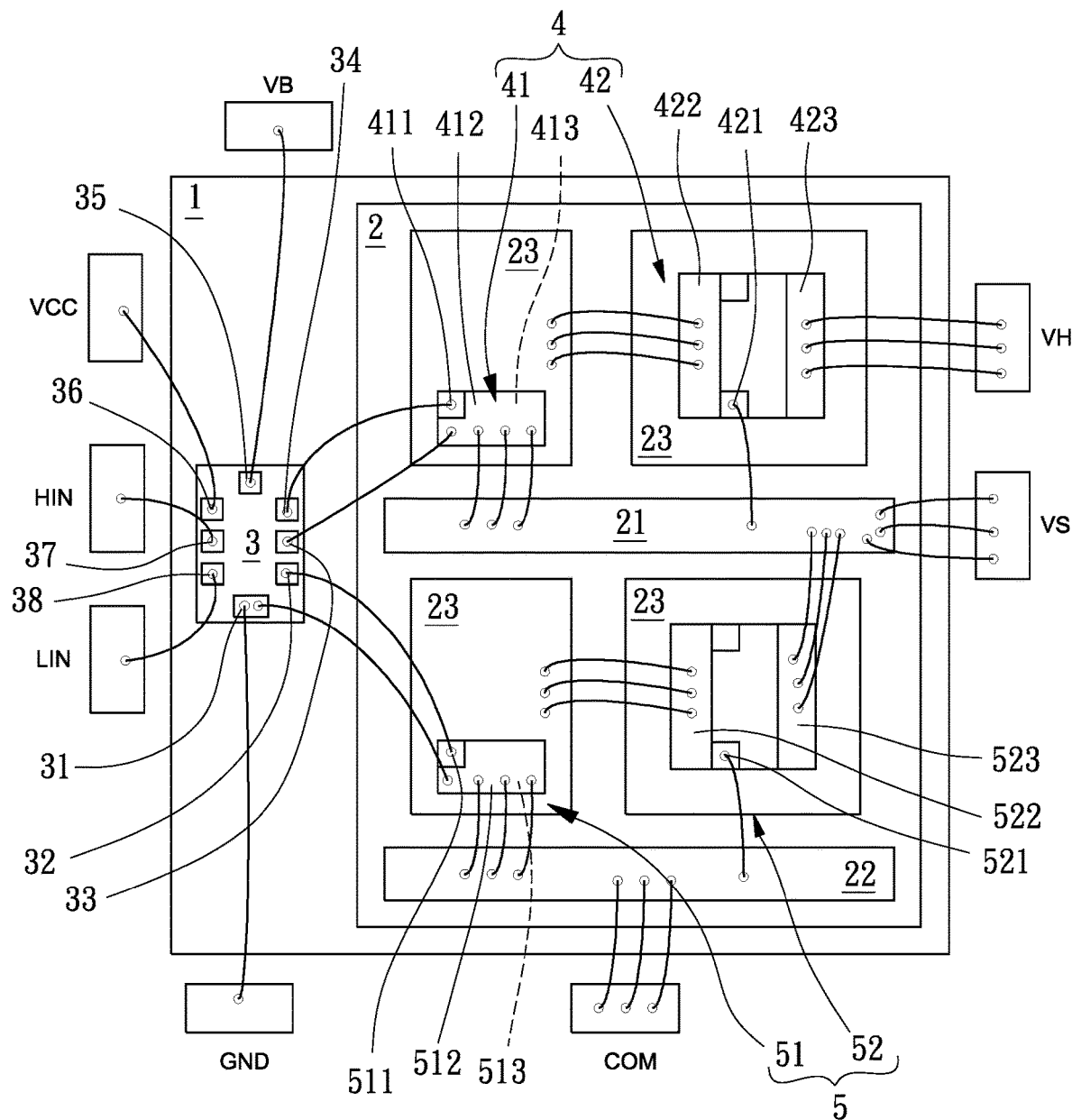
FIG. 4 shows another wiring configuration in the third embodiment of the invention.

Referring to FIGS. 3 and 4, which show the half-bridge circuit package structure in the third embodiment of the present invention. The half-bridge circuit package structure of this embodiment further includes a ground pin GND. The ground pin is electrically connected to the source pad 512 of the second enhancement mode transistor 51. As shown in FIG. 3, the ground pin GND is directly electrically connected to the source pad 512 of the second enhancement mode transistor 51, so as to be indirectly electrically connected to the ground pad 31 of the driving chip 3. Alternatively, as shown in FIG. 4, the ground pin GND may be directly electrically connected to the ground pad 31 of the driving chip 3, and the source pad 512 of the second enhancement mode transistor 51 can be electrically connected to the ground pin GND by the ground pad 31. With the ground pin GND, it can prevent the ground pad 31 from being grounded by the common contact pin COM of a high-current transmission path. In addition, the high side ground pad 33 of the driving chip 3 in this embodiment can also be directly electrically connected to the first metal island 21 as the form in the aforementioned first embodiment. The ground pad 31 of the driver chip 3 can also be directly connected to the second metal island 22 as the form in the aforementioned first embodiment. Both of the above are understood by those skilled in the art.

Figure 5:
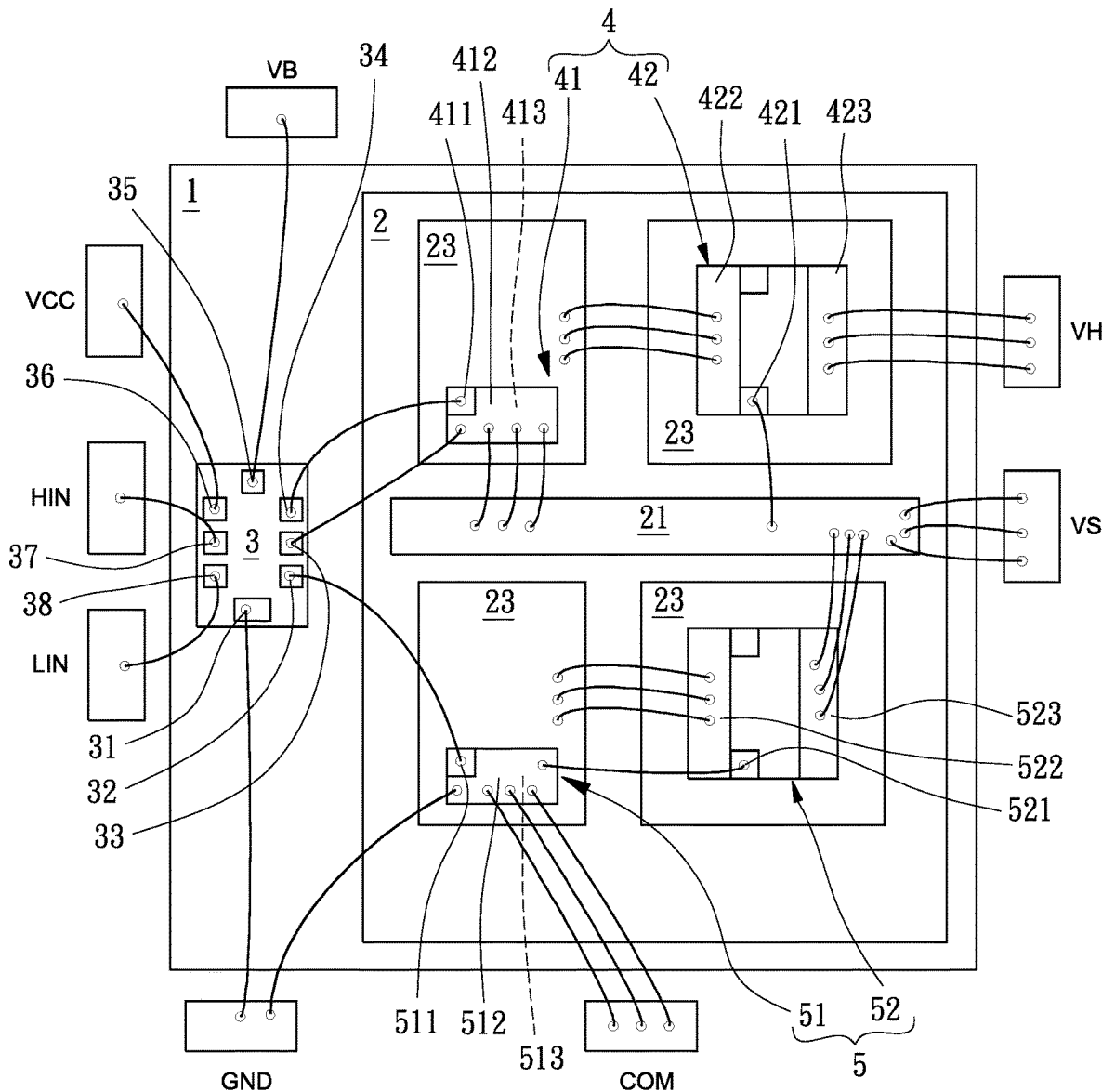
FIG. 5 is a front view of the assembly in the fourth embodiment of the invention.
Figure 6:
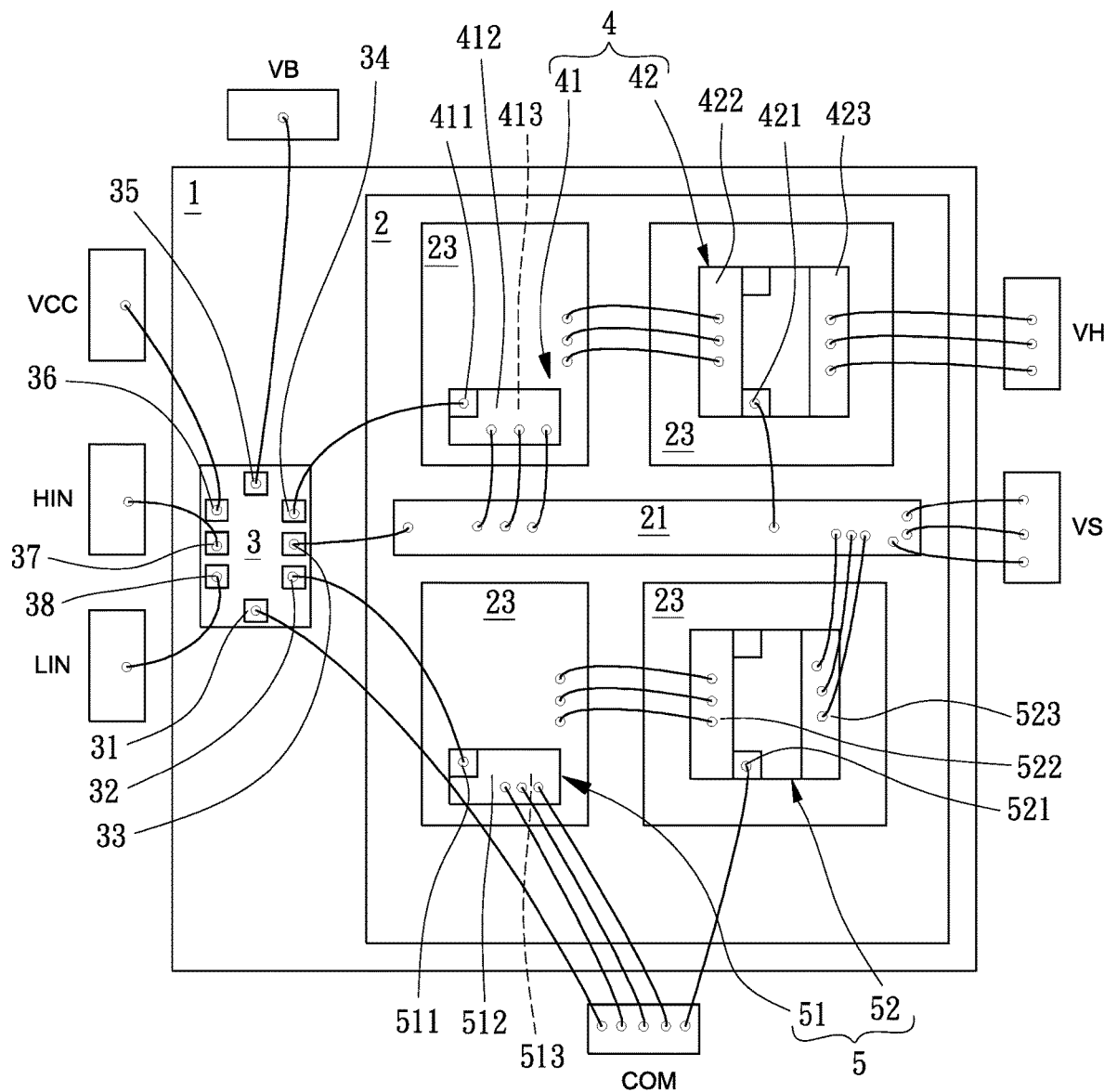
FIG. 6 shows another wiring configuration in the fourth embodiment of the invention.

Referring to FIG. 5, which shows the half-bridge circuit package structure in the fourth embodiment of the present invention. The source pad 512 of the second enhancement mode transistor 51 is directly electrically connected to the common contact pin COM. In this embodiment, the gate pad 521 of the second depletion mode transistor 52 can be directly electrically connected to the source pad 512 of the second enhancement mode transistor 51. Further, the ground pin GND is directly electrically connected the ground pad 31 of the driving chip 3 and the source pad 512 of the second enhancement mode transistor 51, respectively, and the source pad 512 of the second enhancement mode transistor 51 is electrically connected to the ground pad 31 by the ground pin GND. However, as shown in FIG. 6, the gate pad 521 of the second depletion mode transistor 52 and the ground pad 31 can also be directly electrically connected to the common contact pin COM, and the ground pad 31 and the gate pad 521 of the second depletion mode transistor 52 can also be electrically connected to the source pad 512 of the second enhancement mode transistor 51 through the common contact pin COM. As such, the gate pad 521 of the second depletion mode transistor 52 and the source pad 512 of the second enhancement mode transistor 51 are connected without the metal island, which can reduce the space taken by the half-bridge circuit package structure. In addition, the high side ground pad 33 of the driving chip 3 in this embodiment can also be directly electrically connected to the first metal island 21 as the form in the aforementioned first embodiment, which is understood by those skilled in the art.

Figure 7:
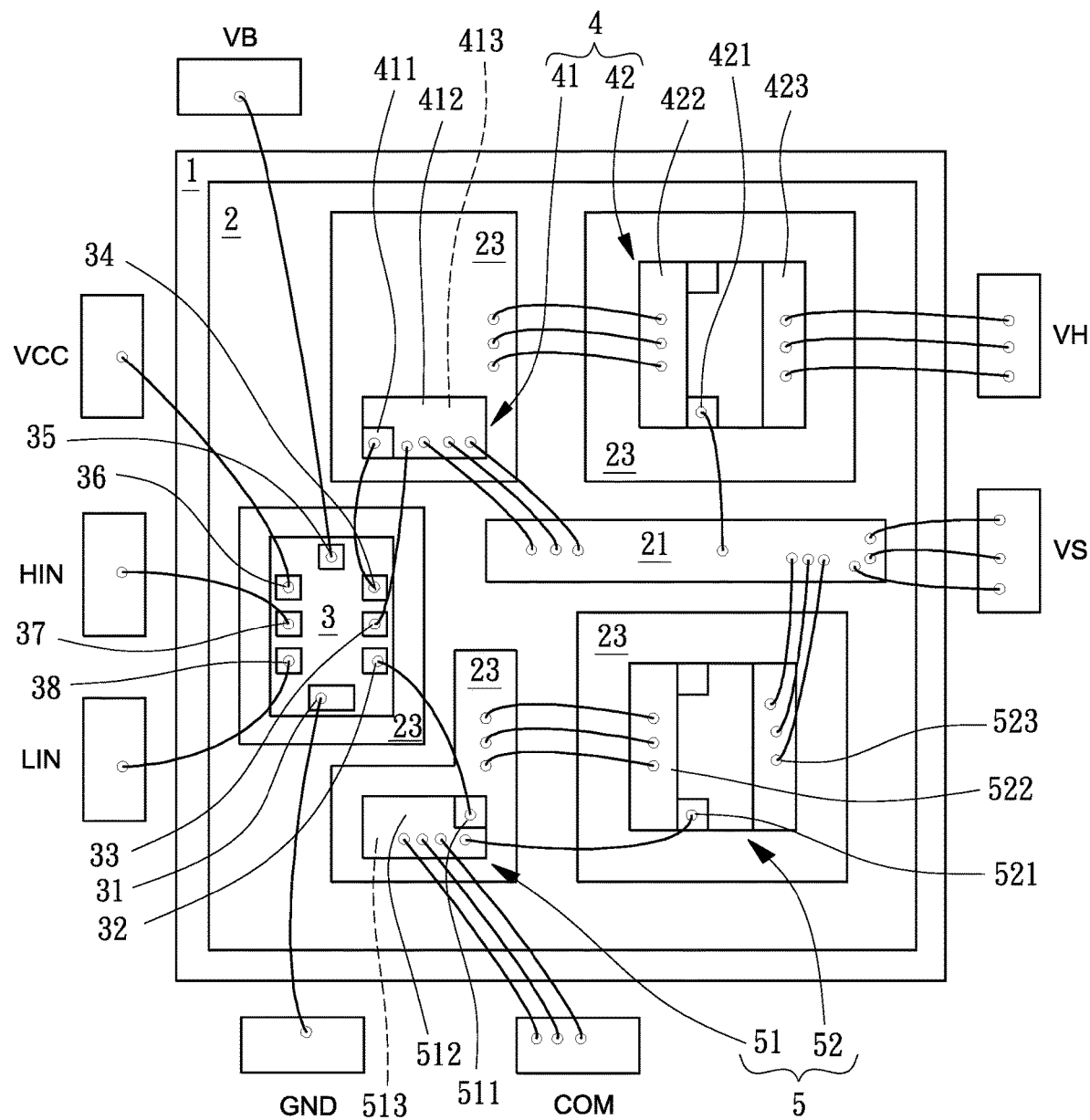
FIG. 7 is a front view of the assembly in the fifth embodiment of the invention.

Referring to FIG. 7, which shows the half-bridge circuit package structure in the fifth embodiment of the present invention. The driving chip 3 is located on one of the plurality of component metal islands 23 on the substrate 2. As such, the component layout area of the half-bridge circuit package structure can be reduced. In addition, the high side ground pad 33 of the driving chip 3 in this embodiment can also be directly electrically connected to the first metal island 21 as the form in the aforementioned first embodiment. The substrate 2 in this embodiment can also have the second metal island 22 as the form in the aforementioned first embodiment, which is understood by those skilled in the art.

Figure 8:
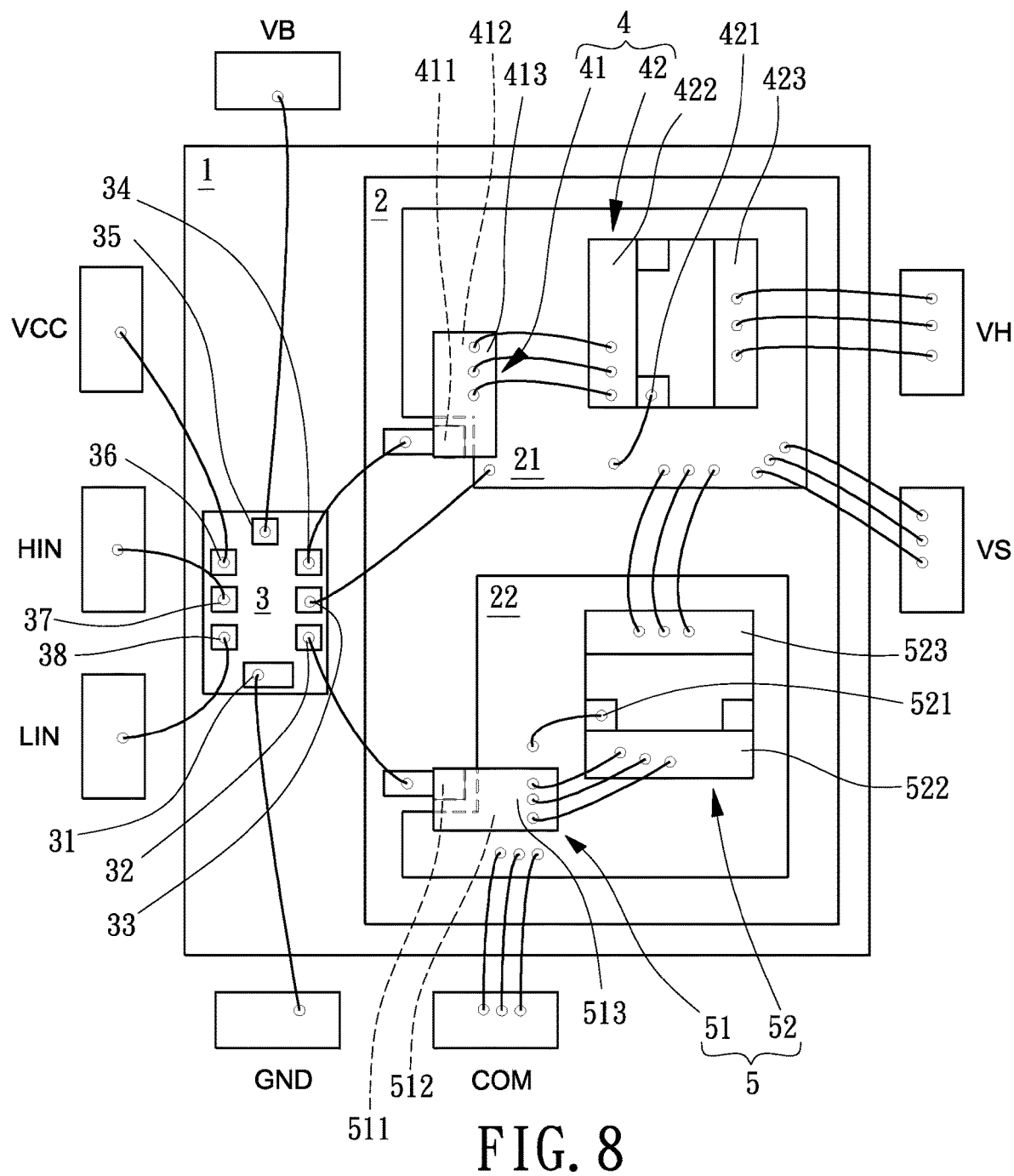
FIG. 8 is a front view of the assembly in the sixth embodiment of the invention.

Referring to FIG. 8, which shows the half-bridge circuit package structure in the sixth embodiment of the present invention. The first depletion mode transistor 42 is located on the first metal island 21. The first enhancement mode transistor 41 is directly connected and conducted to the first metal island 21 by the source pad 412 in a flip chip package method, and is electrically connected to the high side ground pad 33 by the first metal island 21. The source pad 422 of the depletion mode transistor 42 is directly electrically connected to the drain pad 413 of the first enhancement mode transistor 41. Similarly, the second depletion mode transistor 52 is located on the second metal island 22, and the second enhancement mode transistor 51 is directly connected and conducted to the second metal island 22 by its source pad 512 in a flip chip package method. The source pad 522 of the second depletion mode transistor 52 is directly electrically connected to the drain pad 513 of the second enhancement mode transistor 51. By the flip chip connection of the first enhancement mode transistor 41 and/or the second enhancement mode transistor 51, the number of bonding wires and the bonding space during packaging can be reduced. In this embodiment, the driving chip 3 is located on the chip pad 1 instead of on the substrate 2. However, the driving chip 3 can also be located on the substrate 2 as the form in the aforementioned fifth embodiment.

Figure 9:
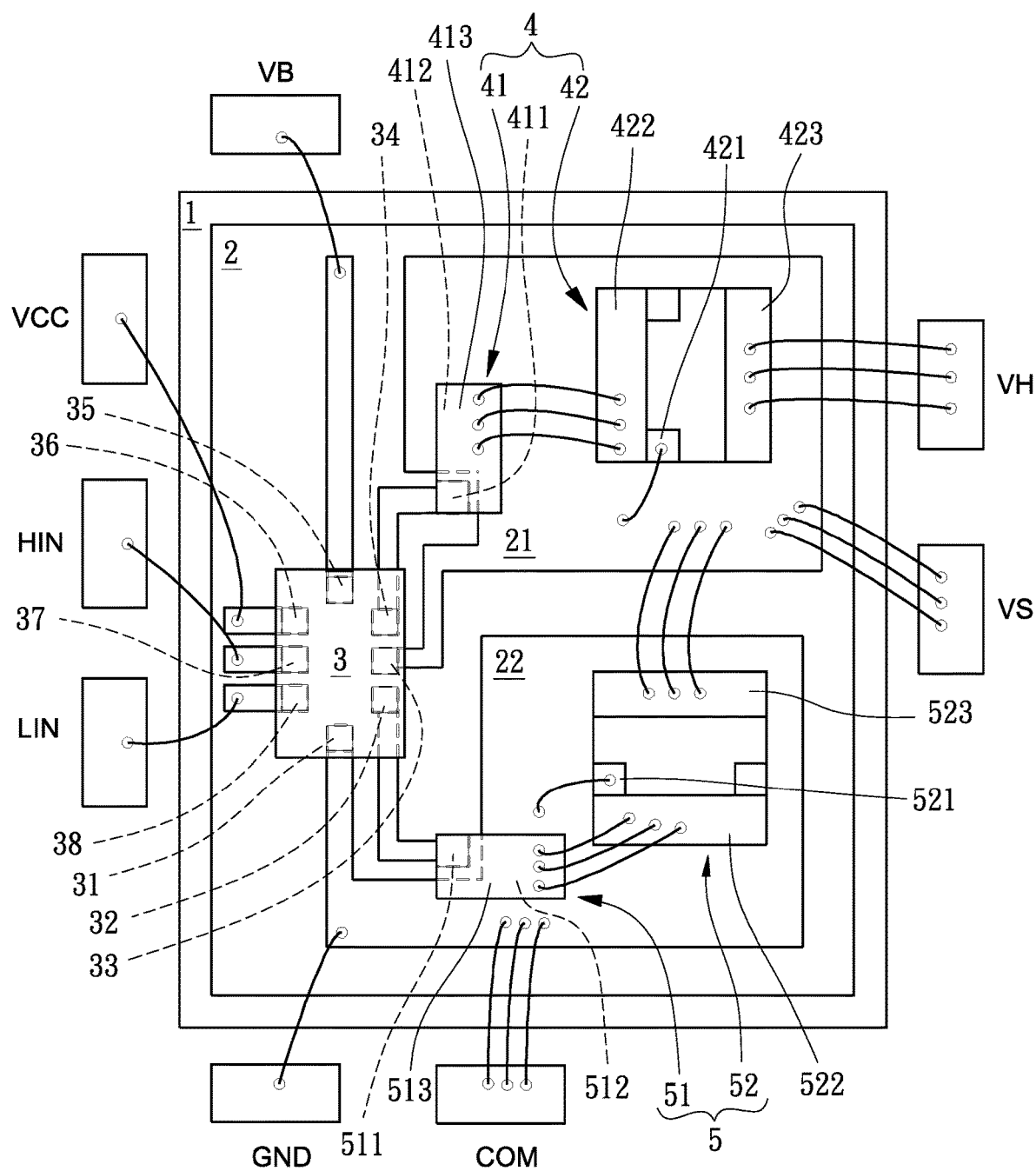
FIG. 9 is a front view of the assembly in the seventh embodiment of the invention.

Referring to FIG. 9, which shows the half-bridge circuit package structure in the seventh embodiment of the present invention. The driving chip 3 is bonded to the substrate 2 in a flip chip package method, so that the high side ground pad 33 of the driving chip 3 faces the substrate 2, and is directly connected and conducted to the first metal island 21. The ground pad 31 of the driving chip 3 faces the substrate 2, and is directly connected and conducted to the second metal island 22. As such, it can further reduce the number of bonding wires and the bonding space during packaging.

In addition, the upper bridge switch 4 in this embodiment can also be located on the two component metal islands 23 as the form in the aforementioned first embodiment. The lower bridge switch 5 can also be located on the two component metal islands 23 as the form in the aforementioned first embodiment, which is understood by those skilled in the art.

In summary, the half-bridge circuit package structure according to the invention includes the substrate with the first metal island. By providing the first metal island as the connection point of the electrical signal, the components of the half-bridge circuit package structure can be conveniently connected to each other, so as to constitute a complete integrated half-bridge circuit in a single package structure. As such, the integrated half-bridge circuit does not need an external connection wire to be completed, ensuring the effect of convenience in use. Furthermore, it can also avoid the interference and energy consumption resulted from the parasitic inductance and parasitic resistance of the external connection wires, ensuring the effect of improving the efficiency of the integrated half-bridge circuit.

Although the invention has been described in detail with reference to its presently preferable embodiments, it will be understood by one of ordinary skill in the art that various modifications can be made without departing from the spirit and the scope of the invention, as set forth in the appended claims.

What is claimed is:

1. A half-bridge circuit package structure comprising:
   a chip pad;
   a substrate bonded to the chip pad, wherein the substrate includes a first metal island electrically connected to a high side ground pin;
   a driving chip disposed on the chip pad, wherein the driving chip includes a ground pad, a low side output pad, a high side ground pad, and a high side output pad, wherein the driver chip is electrically connected to a high side power pin by a high side power pad, to an input power pin by an input power pad, to a high side input pin by a high side input pad, and to a low side input pin by a low side input pad;
   an upper bridge switch bonded to the substrate, wherein the upper bridge switch includes a first enhancement mode transistor and a first depletion mode transistor, wherein a gate pad of the first enhancement mode transistor is electrically connected to the high side output pad, a source pad of the first enhancement mode transistor is electrically connected to the first metal island and the high side ground pad, a gate pad of the first depletion mode transistor is electrically connected to the source pad of the first enhancement mode transistor, a source pad of the first depletion mode transistor is electrically connected to a drain pad of the first enhancement mode transistor, and a drain pad of the first depletion mode transistor is electrically connected to a power pin; and
   a lower bridge switch bonded to the substrate, wherein the lower bridge switch includes a second enhancement mode transistor and a second depletion mode transistor, wherein a gate pad of the second enhancement mode transistor is electrically connected to the low side output pad, a source pad of the second enhancement mode transistor is electrically connected to a common contact pin, a gate pad of the second depletion mode transistor is electrically connected to the source pad of the second enhancement mode transistor, a source pad of the second depletion mode transistor is electrically connected to a drain pad of the second enhancement mode transistor, and a drain pad of the second depletion mode transistor is electrically connected to the high side ground pin.

2. The half-bridge circuit package structure as claimed in claim 1, wherein the substrate is a direct bonded copper substrate, a direct plated copper substrate or a printed circuit board.

3. The half-bridge circuit package structure as claimed in claim 1, wherein the substrate has a plurality of component metal islands, the first enhancement mode transistor and the first depletion mode transistor are respectively located on two of the plurality of component metal islands, the drain pad of the first enhancement mode transistor is electrically connected to the component metal island where the first enhancement mode transistor is located, the source pad of the first depletion mode transistor is electrically connected to the component metal island where the first enhancement mode transistor is located, wherein the second enhancement mode transistor and the second depletion mode transistor are respectively located on two of the plurality of component metal islands, the drain pad of the second enhancement mode transistor is electrically connected to the component metal island where the second enhancement mode transistor is located, and the source pad of the second depletion mode transistor is electrically connected to the component metal island where the second enhancement mode transistor is located.

4. The half-bridge circuit package structure as claimed in claim 1, wherein the high side ground pad is electrically connected to the first metal island, and the source pad of the first enhancement mode transistor is electrically connected to the high side ground pad through the first metal island.

5. The half-bridge circuit package structure as claimed in claim 1, wherein the gate pad of the first depletion mode transistor is electrically connected to the first metal island, and the gate pad of the first depletion mode transistor is electrically connected to the source pad of the first enhancement mode transistor through the first metal island.

6. The half-bridge circuit package structure as claimed in claim 1, wherein the drain pad of the second depletion mode transistor is electrically connected to the first metal island, and the drain pad of the second depletion mode transistor is electrically connected to the high side ground pin through the first metal island.

7. The half-bridge circuit package structure as claimed in claim 1, wherein the substrate has a second metal island, which is electrically connected to the common contact pin, the source pad of the second enhancement mode transistor, and the gate of the second depletion mode transistor.

8. The half-bridge circuit package structure as claimed in claim 7, wherein the ground pad is electrically connected to the second metal island.

9. The half-bridge circuit package structure as claimed in claim 7, wherein the first enhancement mode transistor is directly electrically connected to the first metal island by the source pad of the first enhancement mode transistor, and is electrically connected to the high side ground pad through the first metal island, and wherein the second enhancement mode transistor is directly electrically connected to the second metal island by the source pad of the second enhancement mode transistor.

10. The half-bridge circuit package structure as claimed in claim 7, wherein the driving chip is bonded to the substrate, the high side ground pad of the driving chip faces the substrate and is directly electrically connected to the first metal island, and the ground pad of the driving chip faces the substrate and is directly electrically connected to the second metal island.

11. The half-bridge circuit package structure as claimed in claim 1, wherein the high side ground pad is directly electrically connected to the source pad of the first enhancement mode transistor.

12. The half-bridge circuit package structure as claimed in claim 1, wherein the gate pad of the first depletion mode transistor is directly electrically connected to the source pad of the first enhancement mode transistor.

13. The half-bridge circuit package structure as claimed in claim 1, wherein the drain pad of the second depletion mode transistor is directly electrically connected to the high side ground pin.

14. The half-bridge circuit package structure as claimed in claim 1, wherein the ground pad is directly electrically connected to the source pad of the second enhancement mode transistor.

15. The half-bridge circuit package structure as claimed in claim 1, further comprising a ground pin, wherein the ground pin is electrically connected to the ground pad.

16. The half-bridge circuit package structure as claimed in claim 15, wherein the ground pin is directly electrically connected to the ground pad, and the source pad of the second enhancement mode transistor is electrically connected to the ground pin through the ground pad.

17. The half-bridge circuit package structure as claimed in claim 15, wherein the ground pin is directly electrically connected to the ground pad and the source pad of the second enhancement mode transistor respectively, and the source pad of the second enhancement mode transistor is electrically connected to the ground pad through the ground pin.

18. The half-bridge circuit package structure as claimed in claim 1, wherein the ground pad and the gate pad of the second depletion mode transistor are electrically connected to the source pad of the second enhancement mode transistor through the common contact pin.

19. The half-bridge circuit package structure as claimed in claim 1, wherein the substrate has a plurality of component metal islands, and the driving chip is bonded to one of the plurality of component metal islands of the substrate.

* * * * *